(12) United States Patent
Matsuura et al.

(10) Patent No.: US 12,340,986 B2
(45) Date of Patent: Jun. 24, 2025

(54) PLASMA PROCESSING APPARATUS AND PLASMA PROCESSING METHOD

(71) Applicant: Tokyo Electron Limited, Tokyo (JP)

(72) Inventors: Hiroyuki Matsuura, Iwate (JP); Takeshi Ando, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 504 days.

(21) Appl. No.: 17/361,572

(22) Filed: Jun. 29, 2021

(65) Prior Publication Data

US 2022/0020572 A1      Jan. 20, 2022

(30) Foreign Application Priority Data

Jul. 16, 2020 (JP) .................................. 2020-122162

(51) Int. Cl.
    *H01J 37/32* (2006.01)
(52) U.S. Cl.
    CPC .. *H01J 37/32568* (2013.01); *H01J 37/32183* (2013.01); *H01J 2237/332* (2013.01)
(58) Field of Classification Search
    None
    See application file for complete search history.

(56) References Cited

U.S. PATENT DOCUMENTS

| | | | |
|---|---|---|---|
| 2004/0222188 A1* | 11/2004 | Kim | B08B 7/0035 216/67 |
| 2005/0016456 A1* | 1/2005 | Taguchi | H05H 1/2406 118/723 E |
| 2005/0257890 A1* | 11/2005 | Park | H01L 21/67069 134/1.1 |
| 2006/0201533 A1* | 9/2006 | Wani | H01J 37/32082 134/1.1 |
| 2007/0051387 A1* | 3/2007 | Hwang | C23C 16/4405 134/1.1 |
| 2011/0129618 A1* | 6/2011 | Matsunaga | C23C 16/4404 118/725 |

(Continued)

FOREIGN PATENT DOCUMENTS

| | | |
|---|---|---|
| JP | 2002237480 A * | 8/2002 |
| JP | 2004-343017 | 12/2004 |

(Continued)

*Primary Examiner* — Parviz Hassanzadeh
*Assistant Examiner* — Margaret Klunk
(74) *Attorney, Agent, or Firm* — IPUSA, PLLC (57) ABSTRACT

A plasma processing apparatus includes a cylindrical processing chamber with a sidewall having an opening, to accommodate substrates on respective stages. The plasma processing apparatus includes a plasma compartment wall with an outer surface, the plasma compartment wall being hermetically provided at the sidewall of the processing chamber to close the opening of the sidewall of the processing chamber, and the plasma compartment wall defining a plasma formation space. The plasma processing apparatus includes a first plasma electrode pair consisting of first electrodes, the first electrodes being arranged opposite each other, on opposite sides of the outer surface of the plasma compartment wall. The plasma processing apparatus includes a second plasma electrode pair consisting of second electrodes, the second electrodes being arranged opposite each other, on the opposite sides of the outer surface of the plasma compartment wall.

8 Claims, 6 Drawing Sheets

(56) References Cited

U.S. PATENT DOCUMENTS

| | | | | |
|---|---|---|---|---|
| 2012/0100722 | A1* | 4/2012 | Asai | H01L 21/0337 |
| | | | | 438/758 |
| 2015/0107517 | A1* | 4/2015 | Hasebe | C23C 16/452 |
| | | | | 118/723 R |
| 2018/0019102 | A1* | 1/2018 | Voronin | H01J 37/32082 |
| 2018/0182601 | A1* | 6/2018 | Takeda | C23C 16/505 |

FOREIGN PATENT DOCUMENTS

| | | |
|---|---|---|
| JP | 2008-053298 | 3/2008 |
| JP | 2008-053504 | 3/2008 |
| JP | 2011-009699 | 1/2011 |
| JP | 2011-151081 | 8/2011 |
| JP | 2012-094652 | 5/2012 |
| JP | 2012-114340 | 6/2012 |
| JP | 2012-134199 | 7/2012 |
| JP | 2012-142386 | 7/2012 |
| JP | 2013-225655 | 10/2013 |
| JP | 2014-146805 | 8/2014 |
| JP | 2015-082533 | 4/2015 |
| JP | 2015-092637 | 5/2015 |
| JP | 2015-167157 | 9/2015 |
| JP | 2015-198111 | 11/2015 |
| JP | 2016-106415 | 6/2016 |
| JP | 2016-213033 | 12/2016 |
| JP | 6248707 B2 * | 12/2017 |
| JP | 2018-011050 | 1/2018 |
| JP | 2018-026513 | 2/2018 |
| JP | 2020-074409 | 5/2020 |
| WO | 2018/016131 | 1/2018 |
| WO | 2018/055700 | 3/2018 |

* cited by examiner

PLASMA PROCESSING APPARATUS AND PLASMA PROCESSING METHOD

CROSS-REFERENCE TO RELATED APPLICATION

This patent application claims priority to Japanese Patent Application No. 2020-122162, filed Jul. 16, 2020, the contents of which are incorporated herein by reference in their entirety.

TECHNICAL FIELD

The present disclosure relates to a plasma processing apparatus and a plasma processing method.

BACKGROUND

A technique is known in which an electrode pair for capturing particles is disposed outside a reaction tube, and a formed region of a plasma is provided between electrodes of the electrode pair. During a deposition cycle, a positive-side DC voltage is applied to the electrodes while an atmosphere of the reaction tube changes to another atmosphere (see, for example, Japanese Unexamined Patent Application No. 2015-167157, which is referred to as Patent document 1).

SUMMARY

According to one aspect of the present disclosure, a plasma processing apparatus includes a cylindrical processing chamber with a sidewall having an opening, the processing chamber being configured to accommodate substrates on respective stages. The plasma processing apparatus includes a plasma compartment wall with an outer surface, the plasma compartment wall being hermetically provided at the sidewall of the processing chamber to close the opening of the sidewall of the processing chamber, and the plasma compartment wall defining a plasma formation space. The plasma processing apparatus includes a first plasma electrode pair consisting of first electrodes, the first electrodes being arranged opposite each other, on opposite sides of the outer surface of the plasma compartment wall, first RF power being supplied to the first plasma electrode pair. The plasma processing apparatus includes a second plasma electrode pair consisting of second electrodes, the second electrodes being arranged opposite each other, on the opposite sides of the outer surface of the plasma compartment wall, second RF power being supplied to the second plasma electrode pair.

DETAILED DESCRIPTION

One or more non-limiting examples of embodiments of the present disclosure will be described with reference to the drawings. In each drawing, the same numerals denote the same or corresponding members or components, and duplicate description for the members or components will be omitted.

[Plasma Processing Apparatus]

Figure 1:
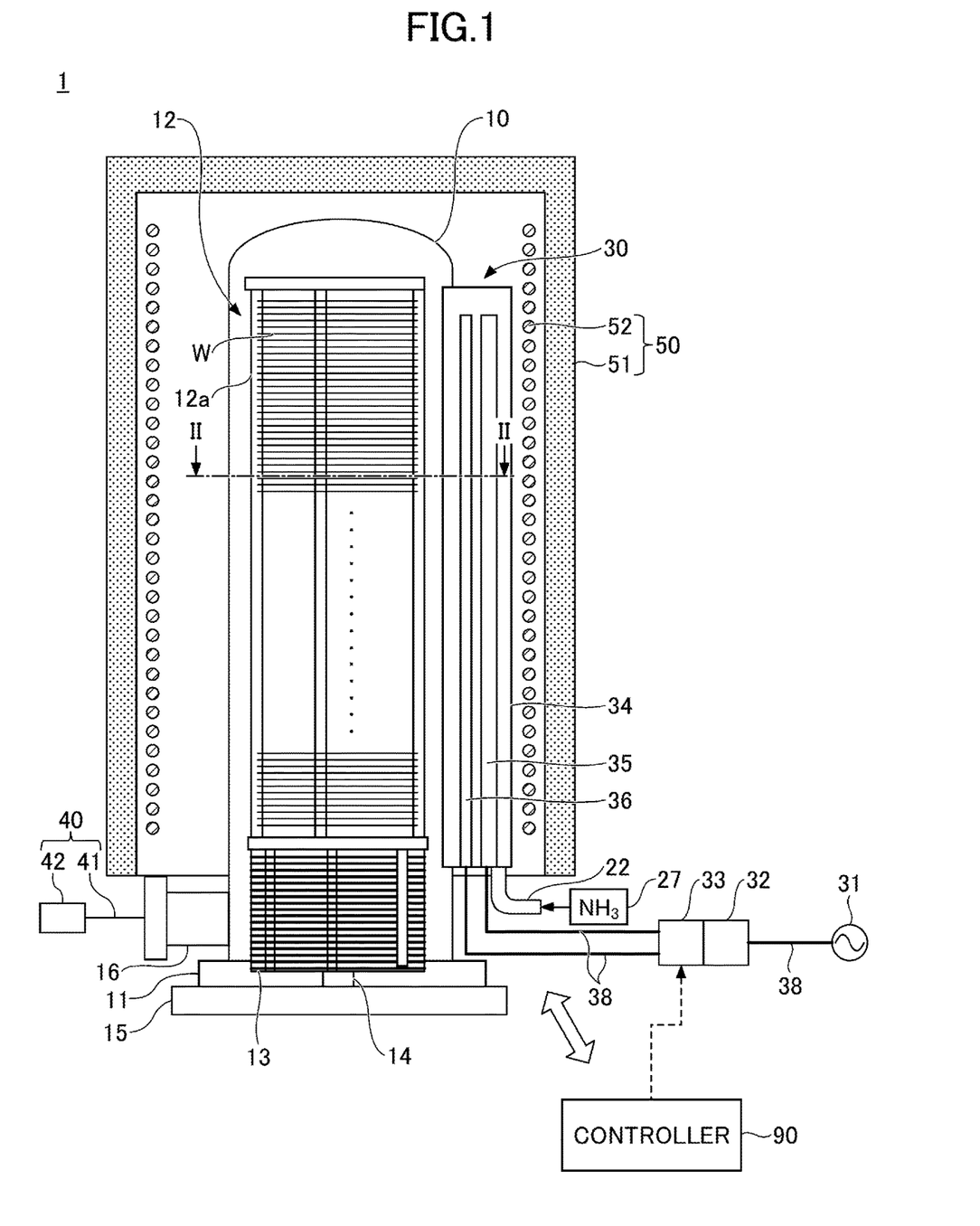
FIG. 1 is a diagram schematically illustrating an example of a plasma processing apparatus according to one embodiment.
Figure 2:
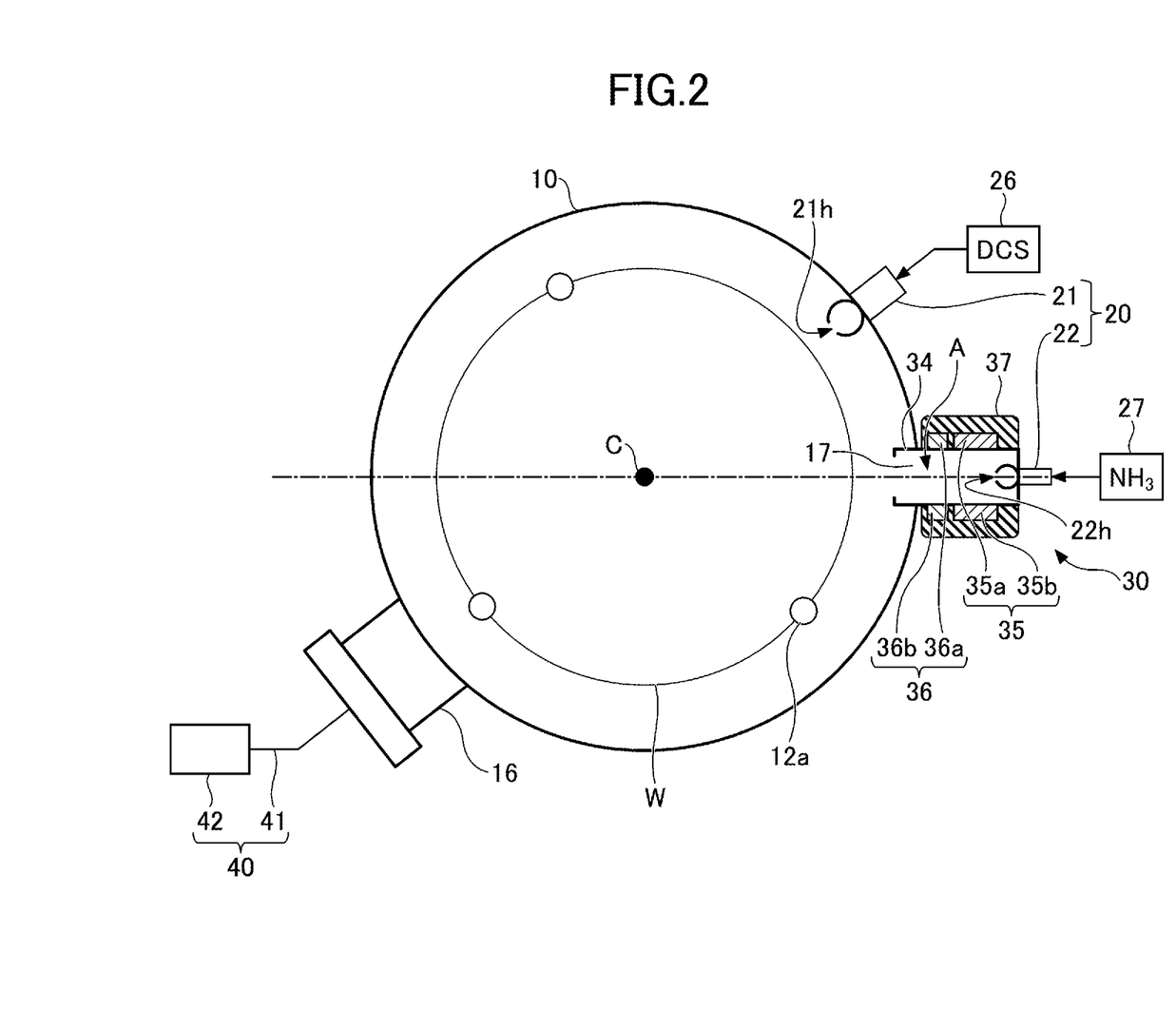
FIG. 2 is a cross-sectional view of the plasma processing apparatus taken along the II-II line in FIG. 1.

A plasma processing apparatus according to one embodiment will be described with reference to FIG. 1. FIG. 1 is a diagram schematically illustrating an example of a plasma processing apparatus 1 according to one embodiment. FIG. 2 is a cross-sectional view of the plasma processing apparatus 1 taken along the II-II line in FIG. 1.

The plasma processing apparatus 1 includes a processing chamber 10, a gas supply 20, a plasma generator 30, an exhauster 40, a heater 50, and a controller 90.

The processing chamber 10 has a longitudinal, cylindrical shape with a ceiling, and a lower end of the shape is open. For example, the entire processing chamber 10 is made of quartz. A metal manifold 11, which is cylindrically molded, is coupled to an opening in the lower end of the processing chamber 10, through a sealing member (not illustrated).

The manifold 11 supports the lower end of the processing chamber 10, and a boat 12 has multiple steps on which substrates W (e.g., 25 to 150 substrates) are mounted from below a top of the manifold 11. The boat 12 is inserted in the processing chamber 10. In such a manner, the substrates W are accommodated substantially horizontally in the processing chamber 10 so as to be located at intervals along a vertical direction. For example, each substrate W is a semiconductor wafer.

The boat 12 is made of, for example, quartz. The boat 12 has three posts 12a, and the substrates W are supported by grooves (not illustrated) formed in the posts 12a. The boat 12 is supported with a heat retaining cylinder 13, which is above a rotating shaft 14.

The heat retaining cylinder 13 is made of, for example, quartz. The heat retaining cylinder 13 suppresses heat dissipation from the opening in the lower end of the processing chamber 10.

The rotating shaft 14 passes through a lid 15. A magnetic fluid seal (not illustrated) is provided at a portion of the rotating shaft 14 through the lid 15 and thus the rotating shaft 14 is hermetically sealed. The rotating shaft 14 is also rotatably supported. The rotating shaft 14 is attached to a tip of an arm supported by a lifting mechanism (not illustrated) such as a boat elevator. The boat 12 and the lid 15 are raised or lowered together, and are inserted in or removed from the processing chamber 10.

The lid 15 is made of, for example, metal. The lid 15 opens or closes an opening in the lower end of the manifold 11. In order to maintain airtightness of the processing chamber 10, a sealing member (not illustrated) is provided between the periphery of the lid 15 and the lower end of the manifold 11.

An exhaust port 16 is located at a lower portion of a sidewall of the processing chamber 10 opposite a gas nozzle 21. The processing chamber 10 is vacuum-evacuated via the exhaust port 16.

The gas supply 20 supplies various gases to the processing chamber 10. For example, the gas supply 20 includes two gas nozzles 21 and 22. However, the gas supply 20 may further have another nozzle, in addition to the gas nozzles 21 and 22.

The gas nozzle 21 is made of, for example, quartz. The gas nozzle 21 has an L-shape that passes inwardly through a sidewall of the manifold 11 and that is bent upwardly to extend upright from a bent portion. An upright portion of the gas nozzle 21 is provided in the processing chamber 10. The gas nozzle 21 is connected to a dichlorosilane (DCS; $SiH_2Cl_2$) gas source 26. Gas holes 21h are formed in the upright portion of the gas nozzle 21 and are arranged at intervals with respect to a vertical length corresponding to given wafers that are supported in the boat 12. For example, each gas hole 21h is oriented toward a center axis C of the processing chamber 10 in a plan view, and DCS gas from each gas hole 21h is horizontally discharged toward the center axis C of the processing chamber 10. However, each gas hole 21h may be oriented in another direction. For example, each gas hole 21h may be be oriented at an angle relative to a direction toward the center axis C of the processing chamber 10, or may be oriented toward a space proximal to the inner wall of the processing chamber 10.

The gas nozzle 22 is made, for example, of quartz. The gas nozzle 22 has an L-shape that is bent upwardly, below the plasma compartment wall 34, and that passes inwardly through a bottom of the plasma compartment wall 34 to extend upright from a bent portion. An upright portion of the gas nozzle 22 is provided at a plasma formation space A. The gas nozzle 22 is connected to an ammonia ($NH_3$) gas source 27. Gas holes 22h are formed in the upright portion of the gas nozzle 22 and are arranged at intervals with a vertical length of the boat 12 corresponding to given wafers that are supported in the boat 12. For example, each gas hole 22h is oriented toward the center axis C of the processing chamber 10 in a plan view, and ammonia gas from each gas hole 22h is horizontally discharged toward the center axis C of the processing chamber 10. However, each gas hole 21h may be oriented in another direction. For example, each gas hole 22h may be oriented at an angle relative to a direction toward the center axis C of the processing chamber 10.

The gas nozzles 21 and 22 are also connected to a purge gas source (not illustrated), and purge gas from each of the gas holes 21h and 22h is discharged into the processing chamber 10. The purge gas may be inert gas such as argon (Ar) gas, nitrogen ($N_2$) gas, or the like.

The plasma generator 30 is provided at a portion of the sidewall of the processing chamber 10. The plasma generator 30 forms a plasma from ammonia gas supplied from the gas nozzle 22 to produce active species. The plasma generator 30 will be described below in detail.

The exhauster 40 vacuum-evacuates the processing chamber 10 through the exhaust port 16. The exhauster 40 includes an exhaust line 41 and an exhausting device 42. The exhaust line 41 is connected to the exhaust port 16. The exhausting device 42 includes a pressure-controlled valve, a vacuum pump, and the like.

A heater 50 heats the substrates W accommodated in the processing chamber 10. The heater 50 includes a heating chamber 51 and a heating wire 52. The heating chamber 51 has a cylindrical shape with a ceiling and is provided to surround the outer periphery of the processing chamber 10. The heating wire 52 is spirally provided on the inner surface of the heating chamber 51.

A controller 90 controls each component of the plasma processing apparatus 1. The controller 90 may be implemented by, for example, a computer. A computer program that causes each component of the plasma processing apparatus 1 to operate is stored in a storage medium. The example of the storage medium may include a flexible disk, a compact disk, a hard disk, a flash memory, a digital versatile disc (DVD), or the like.

<Plasma Generator>

Figure 3:
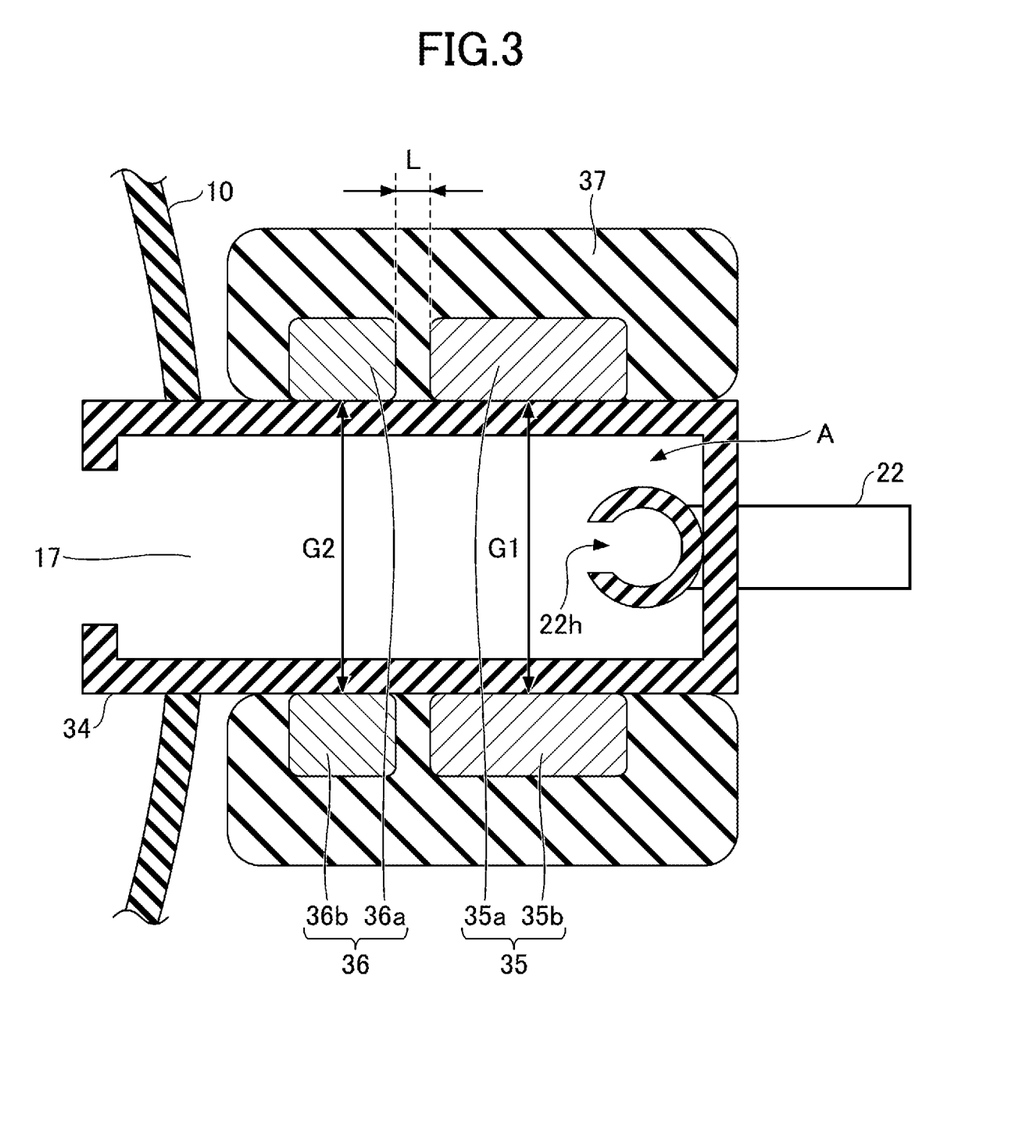
FIG. 3 is an enlarged view of a plasma generator according to one embodiment.
Figure 4:
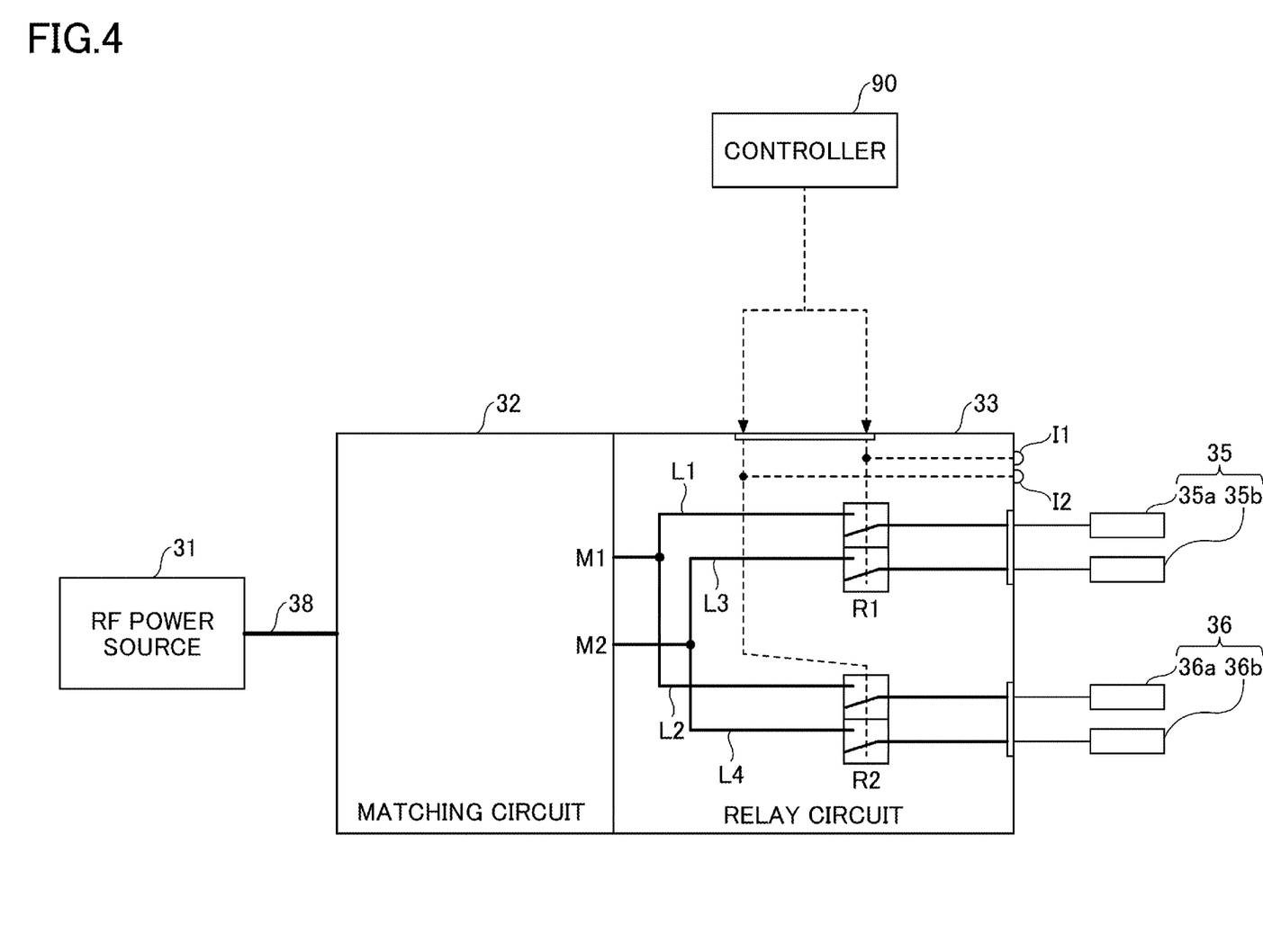
FIG. 4 is a diagram illustrating an example of a circuit configuration of the plasma generator according to one embodiment.

An example of the configuration of the plasma generator 30 will be described with reference to FIG. 3 and FIG. 4. FIG. 3 is an enlarged view of the plasma generator. FIG. 4 is a diagram illustrating an example of a circuit configuration of the plasma generator.

The plasma generator 30 includes a radio frequency (RF) power source 31, a matching circuit 32, a relay circuit 33, and the plasma compartment wall 34. The plasma generator 30 also includes a first plasma electrode pair 35, a second plasma electrode pair 36, an insulating protection cover 37, and a feeder 38.

The RF power source 31 is connected via the feeder 38 to lower ends of given electrodes of each of the first plasma electrode pair 35 and the second plasma electrode pair 36. RF power at a predetermined frequency is applied to each of the first plasma electrode pair 35 and the second plasma electrode pair 36. The predetermined frequency may be, for example, 13.56 MHz, 27.12 MHz, or 40.68 MHz.

The matching circuit 32 is provided between the RF power source 31 and each of the first plasma electrode pair 35 and the second plasma electrode pair 36, in terms of the positional relation with the feeder 38. The matching circuit 32 controls impedance of a plasma side at the plasma formation space A, with respect to the RF power source 31 side. The matching circuit 32 includes a coil and a capacitor (variable capacitor). The matching circuit 32 performs matching by adjusting capacitance of the variable capacitor, in order to minimize power of a reflected wave. The matching circuit 32 may be, for example, an L-shaped matching circuit or a n-shaped matching circuit.

The relay circuit 33 is provided on the output side of the matching circuit 32. In this example, the relay circuit 33 is provided between the matching circuit 32 and each of the first plasma electrode pair 35 and the second plasma electrode pair 36. The relay circuit 33 is an example of a switching unit and is a vacuum relay, for example. The operation of the relay circuit 33 is controlled by the controller 90. The relay circuit 33 splits one output M1 of the matching circuit 32 into two output lines L1 and L2, and splits another output M2 of the matching circuit 32 into two output lines L3 and L4. A relay R1 is provided for the output lines L1 and L3, and two outputs from the relay R1 are connected to the first plasma electrode pair 35. A relay R2 is provided for the output lines L2 and L4, and two outputs from the relay R2 are connected to the second plasma electrode pair 36. Each of the relays R1 and R2 is configured to be turned on or off in accordance with a given control signal from the controller 90. The relay circuit 33 includes indicators I1 and I2 each of which is turned on or off in accordance with a given control signal from the controller 90.

The plasma compartment wall 34 is hermetically welded at the outer wall of the processing chamber 10. The plasma compartment wall 34 is made, for example, of quartz. The plasma compartment wall 34 is C-shaped in cross section and closes an opening 17 formed in the sidewall of the processing chamber 10. The opening 17 is formed to be long and narrow along a vertical direction so as to correspond to all of the substrates W supported in the boat 12. An interior space, i.e., the plasma formation space A, is defined by the plasma compartment wall 34 and communicates with the processing chamber 10. The gas nozzle 22 for discharging ammonia gas, which is used to form a plasma, is provided at the plasma formation space A.

The first plasma electrode pair 35 consists of electrodes 35a and 35b. Each of the electrodes 35a and 35b has a long and narrow plate shape of which the longitudinal direction is directed to a vertical direction. The electrodes 35a and 35b opposite each other are disposed on opposite sides of the outer wall of the plasma compartment wall 34, such that the plasma compartment wall 34 is provided between the electrodes 35a and 35b. The feeder 38 is connected to the lower end of each of the electrodes 35a and 35b, and RF power from the RF power source 31 is applied to each of the electrodes 35a and 35b, via the matching circuit 32 and the relay circuit 33.

The second plasma electrode pair 36 consists of electrodes 36a and 36b. Each of the electrodes 36a and 36b has a long and narrow plate shape of which the longitudinal direction is directed to a vertical direction. The electrodes 36a and 36b opposite each other are disposed on opposite sides of the outer wall of the plasma compartment wall 34, such that the plasma compartment wall 34 is provided between the electrodes 36a and 36b. The feeder 38 is connected to the lower end of each of the electrodes 36a and 36b, and RF power from the RF power source 31 is applied to each of the electrodes 36a and 36b, via the matching circuit 32 and the relay circuit 33. The second plasma electrode pair 36 is provided toward the center axis C of the processing chamber 10 relative to the first plasma electrode pair 35, and is radially disposed next to the first plasma electrode pair 35, at a predetermined distance L from the first plasma electrode pair 35. The predetermined distance L is preferably 10 mm or less, and more preferably 7 mm or less, from the viewpoint of efficiently removing films that are deposited on the inner surface of the plasma compartment wall 34 proximal to the first plasma electrode pair 35. Alternatively, the predetermined distance L is preferably 3 mm or more, and more preferably 4 mm or more, from the viewpoint of suppressing creepage discharge between the first plasma electrode pair 35 and the second plasma electrode pair 36. For example, a distance G2 between the electrodes 36a and 36b of the second plasma electrode pair 36 is the same as a distance G1 between the electrodes 35a and 35b of the first plasma electrode pair 35. For example, an electrode surface area of each of the opposing electrodes 36a and 36b of the second plasma electrode pair 36 is smaller than an electrode surface area of each of the opposing electrodes 35a and 35b of the first plasma electrode pair 35. However, the electrode surface area of each of the opposing electrodes 36a and 36b of the second plasma electrode pair 36 may be the same as the electrode surface area of each of the opposing electrodes 35a and 35b of the first plasma electrode pair 35. Also, for example, the electrode surface area of each of the opposing electrodes 36a and 36b of the second plasma electrode pair 36 may be larger than the electrode surface area of each of the opposing electrodes 35a and 35b of the first plasma electrode pair 35.

The insulating protection cover 37 is attached outside the plasma compartment wall 34 to cover the first plasma electrode pair 35 and the second plasma electrode pair 36. The insulating protection cover 37 is also provided between the electrode 35a of the first plasma electrode pair 35 and the electrode 36a of the second plasma electrode pair 36, as well as between the electrode 35b of the first plasma electrode pair 35 and the electrode 36b of the second plasma electrode pair 36. In such a manner, creepage discharge can be prevented between the electrode 35a of the first plasma electrode pair 35 and the electrode 36a of the second plasma electrode pair 36, as well as between the electrode 35b of the first plasma electrode pair 35 and the electrode 36b of the second plasma electrode pair 36. The insulating protection cover 37 is made of an insulator such as quartz.

The feeder 38 electrically connects the RF power source 31 and each of the first plasma electrode pair 35 and the second plasma electrode pair 36.

[Operation of Plasma Generator]

Figure 5A:
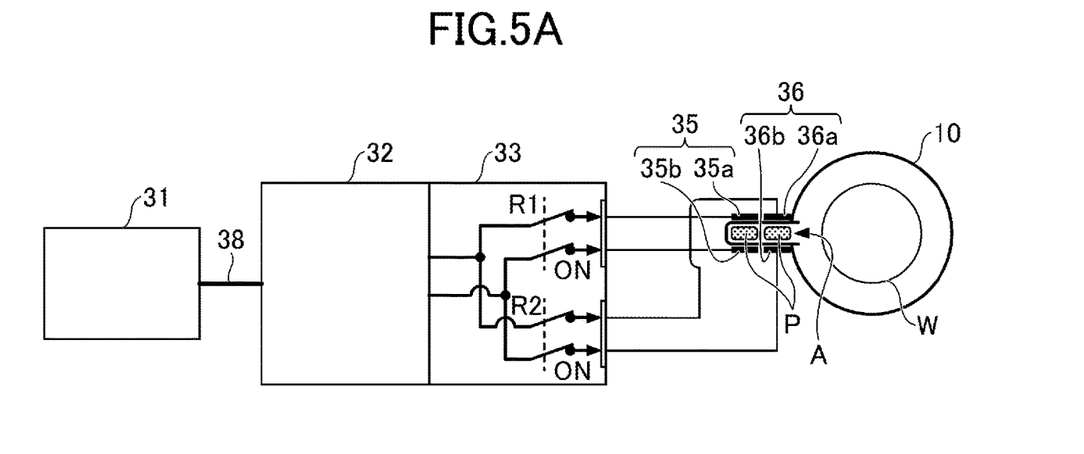
FIGS. 5A to 5C are diagrams for describing an example of the operation of the plasma generator according to one embodiment.
Figure 5B:
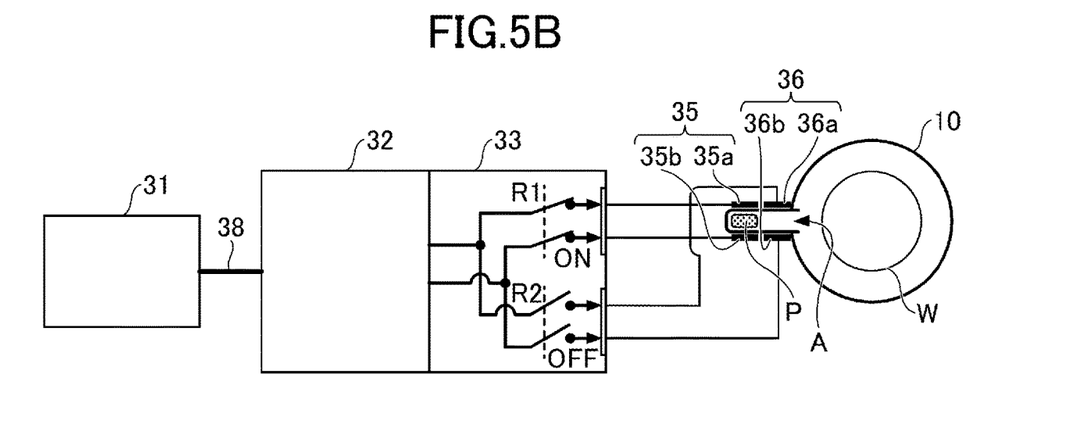
Figure 5C:
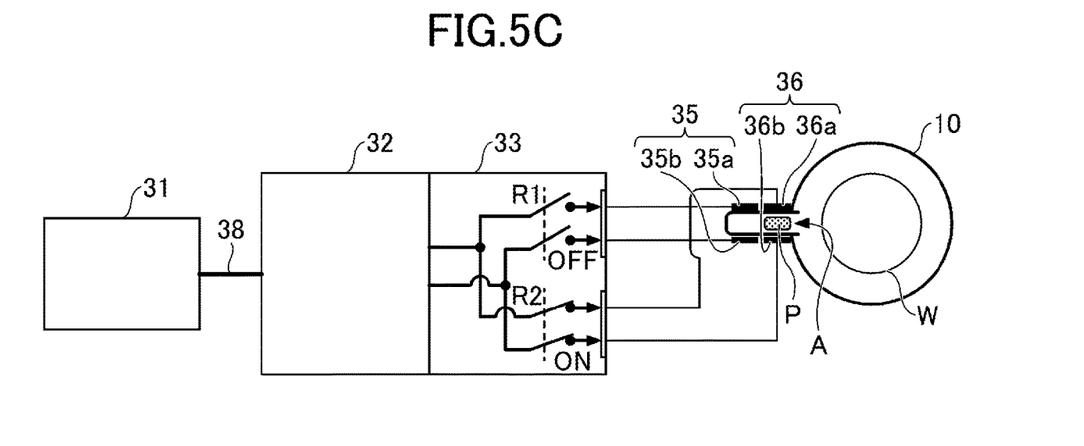

An example of the operation of the plasma generator 30 will be described with reference to FIGS. 5A to 5C. FIGS. 5A to 5C are diagrams illustrating an example of the operation of the plasma generator 30. FIG. 5A illustrates the operation of the plasma generating unit 30 in a state where relays R1 and R2 are turned on. FIG. 5B illustrates the operation of the plasma generator 30 a state in which the relay R1 is turned on and the relay R2 is turned off. FIG. 5C illustrates the operation of the plasma generator 30 in a state in which the relay R1 is turned off and the relay R2 is turned on.

As illustrated in FIG. 5A, when the relays R1 and R2 of the relay circuit 33 are turned on by one or more control signals from the controller 90, RF power from the RF power source 31 is applied to each of the first plasma electrode pair 35 and the second plasma electrode pair 36. In such a case, a plasma P is mainly formed at the plasma formation space A between the electrodes 35a and 35b of the first plasma electrode pair 35, as well as between the electrodes 36a and 36b of the second plasma electrode pair 36.

As illustrated in FIG. 5B, one or more control signals from the controller 90 are used to turn on the relay R1 of the relay circuit 33 and to turn the relay R2 off. In such a case, RF power from the RF power source 31 is applied to the first plasma electrode pair 35, but is not applied to the second plasma electrode pair 36. Thus, a plasma P is mainly formed at the plasma formation space A between the electrodes 35a and 35b of the first plasma electrode pair 35.

As illustrated in FIG. 5C, one or more control signals from the controller 90 are used to turn off the relay R1 of the relay circuit 33 and to turn the relay R2 on. In such a case, RF power from the RF power source 31 is not applied to the first plasma electrode pair 35, but is applied to the second plasma electrode pair 36. Thus, a plasma P is mainly formed at the plasma formation space A between the electrodes 36a and 36b of the second plasma electrode pair 36.

As described above, when the controller 90 turns on or off a given relay among the relays R1 and R2 of the relay circuit 33, connected states of the RF power source 31 to each plasma electrode pair (each of the first plasma electrode pair 35 and the second plasma electrode pair 36) are switched and thus a formed region of the plasma P can be varied. For example, when the controller 90 turns on each of the relays R1 and R2 of the relay circuit 33 to thereby connect the RF power source 31 to each of the first plasma electrode pair 35 and the second plasma electrode pair 36, the formed region of a given plasma P at the plasma formation space A can be expanded. Further, for example, when the controller 90 turns on either the relay R1 or R2 of the relay circuit 33, and turns another relay off, the RF power source 31 becomes connected to a corresponding plasma electrode pair among the first plasma electrode pair 35 and the second plasma electrode pair 36. Thus, the formed region of a given plasma P at the plasma formation space A can be reduced.

<Plasma Processing Method>

Figure 6:
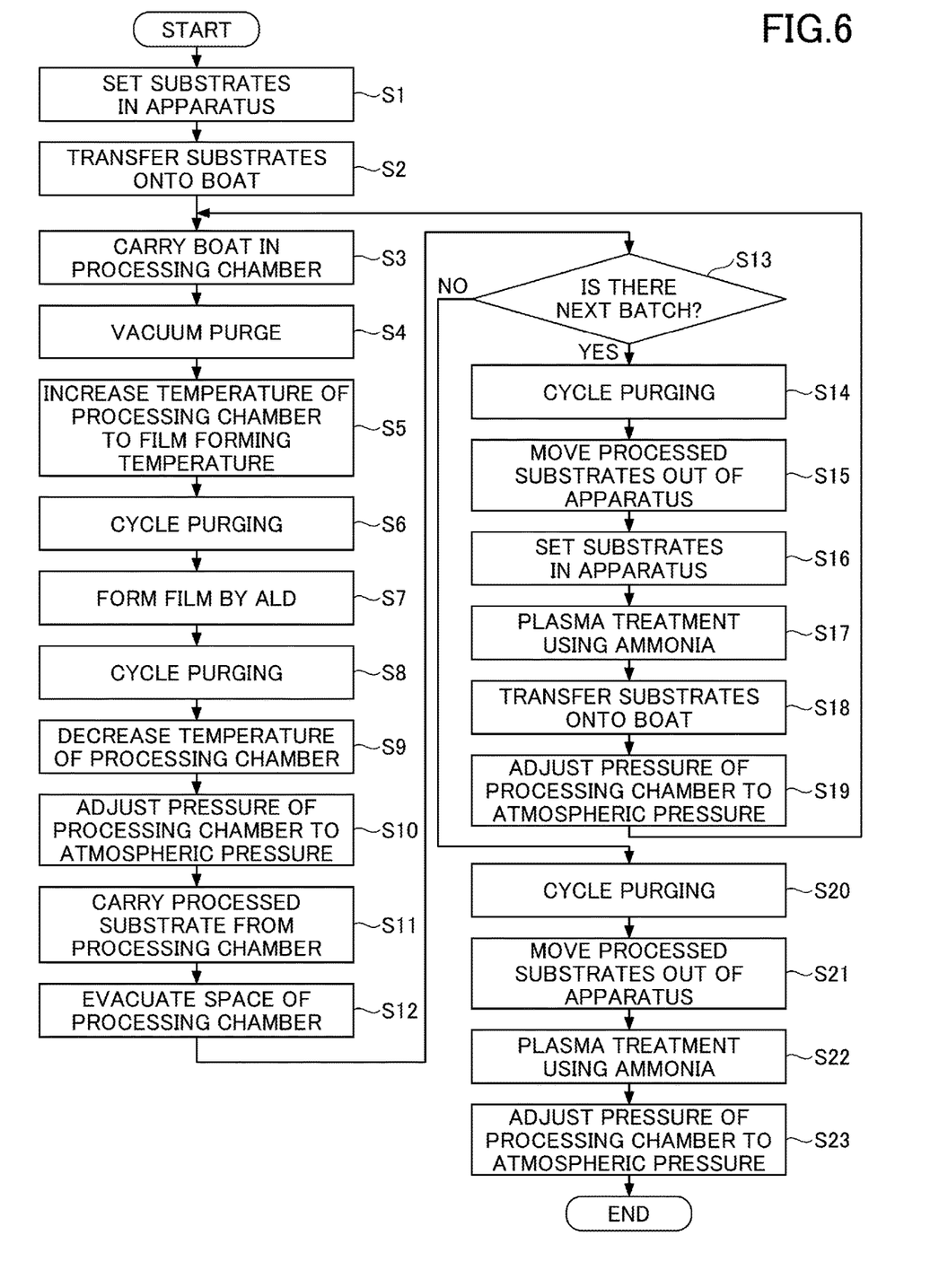
FIG. 6 is a flowchart illustrating an example of a plasma processing method according to one embodiment.

An example of the plasma processing method according to one embodiment will be described with reference to FIG. 6. FIG. 6 is a flowchart illustrating an example of the plasma processing method according to one embodiment. One embodiment will be described using an example in which a silicon nitride film is formed by the plasma processing apparatus 1. For example, the controller 90 controls each component of the plasma processing apparatus 1 to thereby perform the plasma processing method below.

In step S1, one or more substrates to be processed are set in the plasma processing apparatus 1. The substrates are mounted on a load port (not illustrated) in the plasma processing apparatus 1, in a state where the substrates are accommodated in a container called a front-opening unified pod (FOUP).

In step S2, the substrates accommodated in the FOUP, which is mounted on the load port, are transferred onto the boat 12 by a transferring mechanism (not illustrated).

In step S3, a lifting mechanism raises the boat 12 in which the substrates are mounted, and then loads the boat 12 into the processing chamber 10. The temperature of the processing chamber 10 is adjusted to a predetermined temperature through the heater 50.

In step S4, the processing chamber 10 is vacuum purged in a state where the boat 12 is accommodated in the processing chamber 10. For example, the vacuum purge is performed by the exhauster 40 to evacuate the processing chamber 10.

In step S5, the temperature of the processing chamber 10 is increased to a film forming temperature. The film forming temperature is not particularly restricted, and may be between 500° C. and 600° C., for example.

In step S6, cycle purging is performed. The cycle purging is a process to repeat a plurality of times of a cycle of: (i) an evacuation step in which each of the processing chamber 10 and gas lines (for example, gas nozzles 21 and 22) are evacuated, and (ii) a supply step in which inert gas is supplied to the processing chamber 10. By the cycle purging, an atmosphere of the processing chamber 10 becomes an inert gas atmosphere.

In step S7, a film forming process is performed in which a silicon nitride film is formed on a given substrate by atomic layer deposition (ALD). In the film forming process, a cycle in which (i) a supply step of a source gas, (ii) a first purge step, (iii) a nitridation step, and (iv) a second purge step are performed in this order is repeated and thus the silicon nitride film is formed on the given substrate. In the supply step of the source gas, for example, DSC gas as an example of the source gas is supplied to the processing chamber 10 through the gas nozzle 21. In the first purge step, for example, inert gas as an example of purge gas is supplied to the processing chamber 10 through each of the nozzles 21 and 22, and thus silicon source gas remaining in the processing chamber 10 is removed. In the nitridation step, ammonia gas as an example of nitride gas is supplied to the plasma formation space A through the gas nozzle 22, and further, RF power from the RF power source 31 is applied to the first plasma electrode pair 35. In such a manner, a given plasma P is formed at the plasma formation space A. Thus, an active species for nitridation is produced in the given plasma P, and DCS as an example of a raw material is nitrided by the produced active species. In the second purge step, inert gas as an example of purge gas is supplied to the processing chamber 10 through each of the gas nozzles 21 and 22, and thus residual nitride gas is removed from the processing chamber 10.

Note that in the film forming process in step S7, the silicon nitride film may be formed on the inner surface of the plasma compartment wall 34. In this regard, silicon nitride films are unlikely to be deposited on the inner surface of the plasma compartment wall 34, directly below the first plasma electrode pair 35 to which RF power is applied during the film forming process, because sputtering or etching is performed with ions in the plasma. In contrast, silicon nitride films are likely to be deposited on the inner surface of the plasma compartment wall 34, proximal to the first plasma electrode pair 35.

In step S8, cycle purging is performed. For example, the cycle purging may be performed in the same manner as the cycle purging in step S6.

In step S9, a temperature of the processing chamber 10 is decreased to a predetermined temperature. For example, the predetermined temperature is a temperature at which the boat 12 can be transferred from the processing chamber 10.

In step S10, inert gas is supplied to the processing chamber 10 to thereby adjust pressure of the processing chamber 10 to the atmospheric pressure.

In step S11, a given lifting mechanism lowers the boat 12 in which the substrates (hereinafter, referred to as the "processed substrate") processed in the film forming process are mounted. Then, the boat 12 is unloaded from the processing chamber 10. The processed substrates mounted in the boat 12 are cooled.

In step S12, the opening in the lower end of the processing chamber 10 is hermetically closed with a shutter (not illustrated), and the processing chamber 10 is evacuated by the exhauster 40.

In step S13, it is determined whether there is a batch (hereinafter, referred to as the "next batch") of substrates to be processed subsequently in the plasma processing apparatus 1. In step S13, if it is determined that there is the next batch, the process proceeds to step S14. In contrast, in step S13, if it is determined that there is no next batch, the process proceeds to step S20.

In step S14, cycle purging is performed. For example, the cycle purging may be performed in the same manner as the cycle purging in step S6.

In step S15, the processed substrates are transferred from the boat 12 to a given FOUP mounted on the load port, and the processed substrates are moved out of the plasma processing apparatus 1. Note that step S15 and step S14 are preferably performed simultaneously from the viewpoint of improving productivity.

In step S16, substrates to be used for the next batch are transferred to the plasma processing apparatus 1. The substrates are mounted on a given load port of the plasma processing apparatus 1, in a state where the substrates are accommodated in a given FOUP, for example. Note that step S16, as well as step S14 and step S15, are preferably performed simultaneously from the viewpoint of improving productivity.

In step S17, plasma treatment is performed using ammonia. In the plasma treatment using ammonia, ammonia gas is supplied from the gas nozzle 22 to the plasma formation space A, and then RF power is applied by the RF power source 31 to the second plasma electrode pair 36. Thus, a plasma P is mainly formed between the electrodes 36a and 36b of the second plasma electrode pair 36. In such a manner, silicon nitride films, which are deposited in the film forming process in step S6, deposited on the inner surface of the plasma compartment wall 34, proximal to the first plasma electrode pair 35, are removed by etching.

In step S18, the substrates accommodated in the FOUP, which is mounted on the load port, are transferred onto the boat 12 by a given transferring mechanism. Note that step S18 and step S17 are preferably performed simultaneously from the viewpoint of improving productivity.

In step S19, inert gas is supplied to the processing chamber 10 to thereby adjust pressure of the processing chamber 10 to the atmospheric pressure. Then, the process returns to step S3.

In step S20, cycle purging is performed. For example, the cycle purging may be performed in the same manner as the cycle purging in step S6.

In step S21, the processed substrates are transferred from the boat 12 onto a given FOUP mounted on the load port. Then, the processed substrates are moved out of the plasma processing apparatus 1. Step S21 and step S20 are preferably performed simultaneously from the viewpoint of improving productivity.

In step S22, plasma treatment is performed using ammonia. The plasma treatment using ammonia may be performed in the same manner as the plasma treatment using ammonia in step S17.

In step S23, inert gas is supplied to the processing chamber 10 to thereby adjust pressure of the processing chamber 10 to the atmospheric pressure. Then, the process is terminated.

Note that in step S13, if it is determined that there is no next batch, the process may be terminated without performing at least one step among step S22 in which plasma treatment is performed using ammonia and step S23 in which pressure of the processing chamber 10 is adjusted to the atmospheric pressure.

As described above, in the plasma processing method according to one embodiment, ammonia gas is supplied to the processing chamber 10, and further, RF power is applied to the second plasma electrode pair 36. Thus, a given plasma P is mainly formed between the electrodes 36a and 36b of the second plasma electrode pair 36. In such a manner, silicon nitride films deposited on the inner surface of the plasma compartment wall 34 proximal to the first plasma electrode pair 35, in the film forming process, are removed by etching. Thus, even when the plasma is formed with respect to the inner surface of the plasma compartment wall 34, generation of particles can be suppressed and a dry clean cycle can be thereby increased by about two times, in comparison to conventional methods. As a result, an increased operating rate of a given apparatus is set, and thus the number of steps to be performed for quality control, as well as material costs, can be reduced. Note that when a given substrate is set in the plasma processing apparatus 1, and then an ALD process of a silicon nitride film is repeated, a total film thickness exceeds a threshold, and consequently the amount of particles generated on the surface of the given substrate might be increased. In light of the point described above, at a timing at which a target film thickness reaches a given total film thickness determined in order for the particle amount not to exceed a management value, silicon nitride films on the inner wall of the processing chamber 10 are removed by dry-cleaning. A period between two dry clean processes is referred to as a "dry clean cycle," and a length of the dry clean cycle is expressed by a given total film thickness (μm).

If a large amount of silicon nitride films were deposited on the inner surface of the plasma compartment wall 34, a portion of the deposited silicon nitride films might peel off by the effect of the plasma in the film forming process, and consequently the peeled film portion might adhere to a given substrate surface as particles. In particular, particles adhering to the substrate surface would be likely to occur at the plasma formation space A that is mainly provided proximal to a given substrate. Therefore, as described in the plasma processing method according to one embodiment, reductions in the amount of the silicon nitride film formed on the inner surface of the plasma compartment wall 34 are effective in reducing particles to adhere to a given substrate surface.

In the plasma processing method according to one embodiment, after the film forming process of silicon nitride films is completed and then processed substrates are moved out of the plasma processing apparatus 1, plasma treatment using ammonia is performed in a period until substrates for the next batch are transferred into the processing chamber 10. In such a manner, a dry clean cycle can be increased without reducing productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

In the above embodiments, the first plasma electrode pair and the second plasma electrode pair are coupled to a common RF power source. However, the present disclosure is not limited to the example described above. For example, each of the first plasma electrode pair and the second plasma electrode pair may be coupled to a different RF power source. In this case, a relay circuit need not be provided.

In the embodiments, each of two plasma electrode pairs (first plasma electrode pair and second plasma electrode pair) is provided on opposite sides of the outer surface of the plasma compartment wall. However, the present disclosure is not limited to the example described above. For example, three or more plasma electrode pairs may be provided on opposite sides of the outer surface of the plasma compartment wall. In this case, in a given relay circuit, the output of the matching circuit 32 may split to enable a switchable supply of RF power from a given RF power source to three or more plasma electrode pairs.

In the embodiments, silicon nitride films deposited on the inner surface of the plasma compartment wall 34 are removed by plasma treatment using ammonia. However, the present disclosure is not limited to the example described above. For example, instead of plasma treatment using ammonia, plasma treatment using nitrogen or plasma treatment using argon may be used to remove the silicon nitride films deposited on the inner surface of the plasma compartment wall 34.

In the embodiments, the processing chamber is described using a single channel-structured chamber. However, the present disclosure is not limited to the example described above. For example, the processing chamber may be a double-channel structured chamber.

In the embodiments described above, the substrate is a semiconductor wafer, but the present disclosure is not limited thereto. For example, the substrate may be a large substrate for a flat panel display (FPD), a substrate for an organic EL panel, or a substrate for a solar cell.

According to the present disclosure, a dry clean cycle can be increased.

What is claimed is:

1. A plasma processing apparatus comprising:
a cylindrical processing chamber with a sidewall having an opening, the processing chamber being configured to accommodate substrates on respective stages;

a plasma compartment wall with an outer surface, the plasma compartment wall being hermetically provided at the sidewall of the processing chamber to close the opening of the sidewall of the processing chamber, and the plasma compartment wall defining a plasma formation space;

a first plasma electrode pair consisting of first electrodes, the first electrodes being arranged opposite each other, on opposite sides of the outer surface of the plasma compartment wall, first RF power being supplied to the first plasma electrode pair;

a second plasma electrode pair consisting of second electrodes, the second electrodes being arranged opposite each other, on the opposite sides of the outer surface of the plasma compartment wall, second RF power being supplied to the second plasma electrode pair;

a controller configured to cause:
  depositing of a film on substrates positioned in the processing chamber, wherein a film is deposited on an inner side of the plasma compartment wall, while causing the RF power source to supply the first RF power to only the first plasma electrode pair, and
  after the depositing is completed, etching of the film deposited on the inner side of the plasma compartment wall while causing the RF power source to supply the second RF power to the second plasma electrode pair;

wherein the first plasma electrode pair is disposed next to the second plasma electrode pair, in a radial direction of the processing chamber.

2. The plasma processing apparatus according to claim 1, wherein the second plasma electrode pair is disposed at a distance from the first plasma electrode pair, the distance being between 3 mm and 10 mm.

3. The plasma processing apparatus according to claim 1, wherein a distance between the second electrodes of the second plasma electrode pair is equal to a distance between the first electrodes of the first plasma electrode pair.

4. The plasma processing apparatus according to claim 1, wherein an area of each second electrode of the second plasma electrode pair differs from an area of each first electrode of the first plasma electrode pair.

5. The plasma processing apparatus according to claim 1, further comprising:
  a switching circuit configured to switch connected states of the RF power source to each of the first plasma electrode pair and the second plasma electrode pair.

6. The plasma processing apparatus according to claim 5, wherein the switching circuit includes a relay circuit.

7. The plasma processing apparatus according to claim 1, further comprising:
  an insulator provided to cover the first plasma electrode pair, the second plasma electrode pair, and spaces between the first electrodes and the second electrodes.

8. The plasma processing apparatus according to claim 1, wherein the second plasma electrode pair is disposed in a plan view toward a center axis of the processing chamber, relative to the first plasma electrode pair,
  wherein the first RF power is supplied to the first plasma electrode pair upon occurrence of a condition in which the substrates are positioned in the processing chamber, and
  wherein the second RF power is supplied to the second plasma electrode pair upon occurrence of a condition in which no substrate is positioned in the processing chamber.

* * * * *